United States Patent
Peng

(10) Patent No.: US 12,237,029 B2
(45) Date of Patent: Feb. 25, 2025

(54) TESTING METHOD AND TESTING SYSTEM

(71) Applicant: NANYA TECHNOLOGY CORPORATION, New Taipei (TW)

(72) Inventor: Bo Jung Peng, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 67 days.

(21) Appl. No.: 18/055,422

(22) Filed: Nov. 15, 2022

(65) Prior Publication Data
US 2024/0161847 A1    May 16, 2024

(51) Int. Cl.
*G11C 29/10* (2006.01)
*G01R 31/28* (2006.01)
*G01R 31/317* (2006.01)

(52) U.S. Cl.
CPC .......... *G11C 29/10* (2013.01); *G01R 31/2837* (2013.01); *G01R 31/31725* (2013.01)

(58) Field of Classification Search
CPC ............... G11C 29/10; G01R 31/2837; G01R 31/31725
See application file for complete search history.

(56) References Cited

U.S. PATENT DOCUMENTS

| | | | |
|---|---|---|---|
| 5,703,823 A * | 12/1997 | Douse | G11C 11/406 365/225.7 |
| 2003/0227307 A1 * | 12/2003 | Le | G11C 11/406 327/156 |
| 2022/0406394 A1 * | 12/2022 | Wang | G11C 29/08 |

* cited by examiner

*Primary Examiner* — Cynthia Britt
*Assistant Examiner* — Rong Tang
(74) *Attorney, Agent, or Firm* — CKC & Partners Co., LLC

(57) ABSTRACT

A testing method includes the following steps of: inputting a first signal to a memory chip; putting the memory chip into a self-refresh mode according to the first signal; inputting an active command to test the memory chip so as to generate a first testing result according to the first signal; adjusting a bandwidth of the first signal to generate a second signal so as to input to the memory chip; putting the memory chip into the self-refresh mode according to the second signal; inputting the active command to test the memory chip so as to generate a second testing result according to the second signal; and calculating a self-refresh rate of the memory chip according to the first testing result and the second testing result.

20 Claims, 4 Drawing Sheets

TESTING METHOD AND TESTING SYSTEM

BACKGROUND

Field of Invention

The present disclosure relates to a method and an electronic system. More particularly, the present disclosure relates to a testing method and a testing system.

Description of Related Art

Testers use retention methods to test a self-refresh of a memory. A process of testing a self-refresh rate of a memory is usually in a high temperature range and takes a lot of time cost.

For the foregoing reason, there is a need to provide some testing method to solve the problems of the prior art.

SUMMARY

One aspect of the present disclosure provides a testing method. The testing method includes the following steps of: inputting a first signal to a memory chip; putting the memory chip into a self-refresh mode according to the first signal; inputting an active command to test the memory chip so as to generate a first testing result according to the first signal; adjusting a bandwidth of the first signal to generate a second signal so as to input to the memory chip; putting the memory chip into the self-refresh mode according to the second signal; inputting the active command to test the memory chip so as to generate a second testing result according to the second signal; and calculating a self-refresh rate of the memory chip according to the first testing result and the second testing result.

Another aspect of the present disclosure provides a testing system. The testing system includes a memory chip and a test equipment. The test equipment is coupled to the memory chip, and is configured to generate a first signal and an active command. The test equipment is configured to input the first signal to the memory chip. The test equipment is configured to put the memory chip into a self-refresh mode according to the first signal. The test equipment is configured to input the active command to test the memory chip so as to generate a first testing result according to the first signal. The test equipment is configured to adjust a bandwidth of the first signal to generate a second signal so as to input to the memory chip. The test equipment is configured to put the memory chip into the self-refresh mode according to the second signal. The test equipment is configured to input the active command to test the memory chip so as to generate a second testing result according to the second signal. The test equipment is configured to calculate a self-refresh rate of the memory chip according to the first testing result and the second testing result.

These and other aspects of the present disclosure will become apparent from the following description of the preferred embodiment taken in conjunction with the following drawings, although variations and modifications therein may be effected without departing from the spirit and scope of the novel concepts of the disclosure.

It is to be understood that both the foregoing general description and the following detailed description are by examples, and are intended to provide further explanation of the present disclosure as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
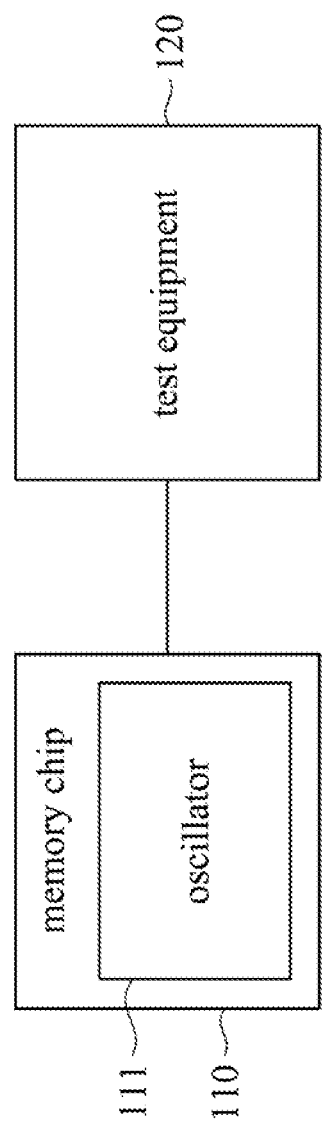
FIG. 1 depicts a schematic diagram of a testing system according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 depicts a schematic diagram of a testing system 100 according to one embodiment of the present disclosure. In some embodiments, please refer to FIG. 1, the testing system 100 includes a memory chip 110 and a test equipment 120. In some embodiments, the test equipment 120 is coupled to the memory chip 110.

In some embodiments, the test equipment 120 is configured to generate a first signal and an active command. The test equipment 120 is configured to input the first signal to a memory chip. The test equipment 120 is configured to put the memory chip 110 into a self-refresh mode according to the first signal. The test equipment 120 is configured to input the active command to test the memory chip 110 so as to generate a first testing result according to the first signal.

Then, the test equipment 120 is configured to adjust a bandwidth of the first signal to generate a second signal so as to input to the memory chip 110. The test equipment 120 is configured to put the memory chip 110 into the self-refresh mode according to the second signal. The test equipment 120 is configured to input the active command to test the memory chip 110 so as to generate a second testing result according to the second signal. The test equipment 120 is configured to calculate a self-refresh rate of the memory chip 110 according to the first testing result and the second testing result.

In some embodiments, the memory chip 110 includes a double data rate (DDR) synchronous dynamic random access memory (SDRAM).

In some embodiments, each of the first signal and the second signal includes a clock enable signal (CKE signal).

In some embodiments, the memory chip 110 includes an oscillator 111. The oscillator 111 is configured to observe a data state of data stored in the memory chip 110 when the memory chip 110 receives the active command.

Figure 2:
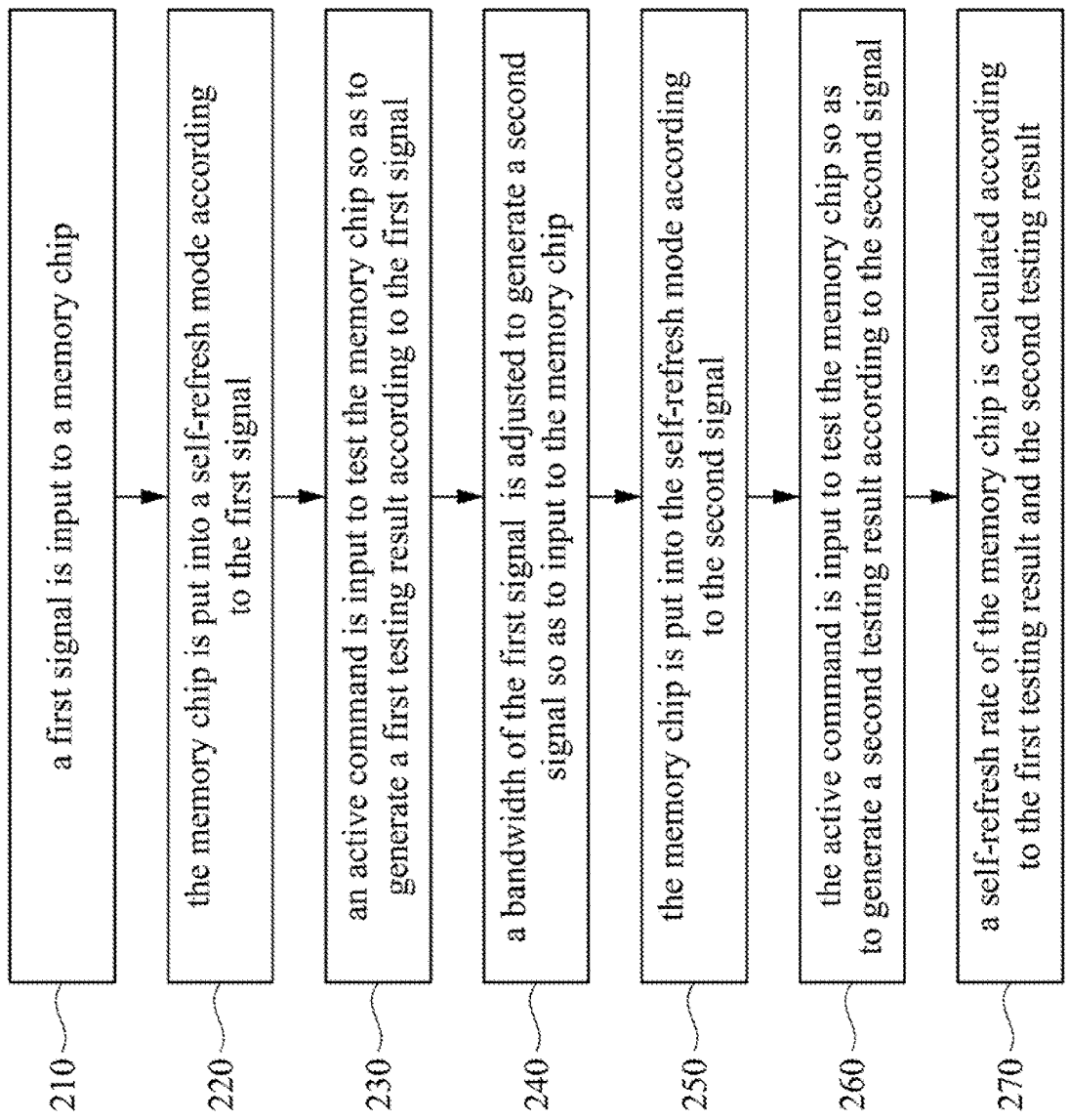
FIG. 2 depicts a flow chart of a testing method according to one embodiment of the present disclosure.
Figure 3:
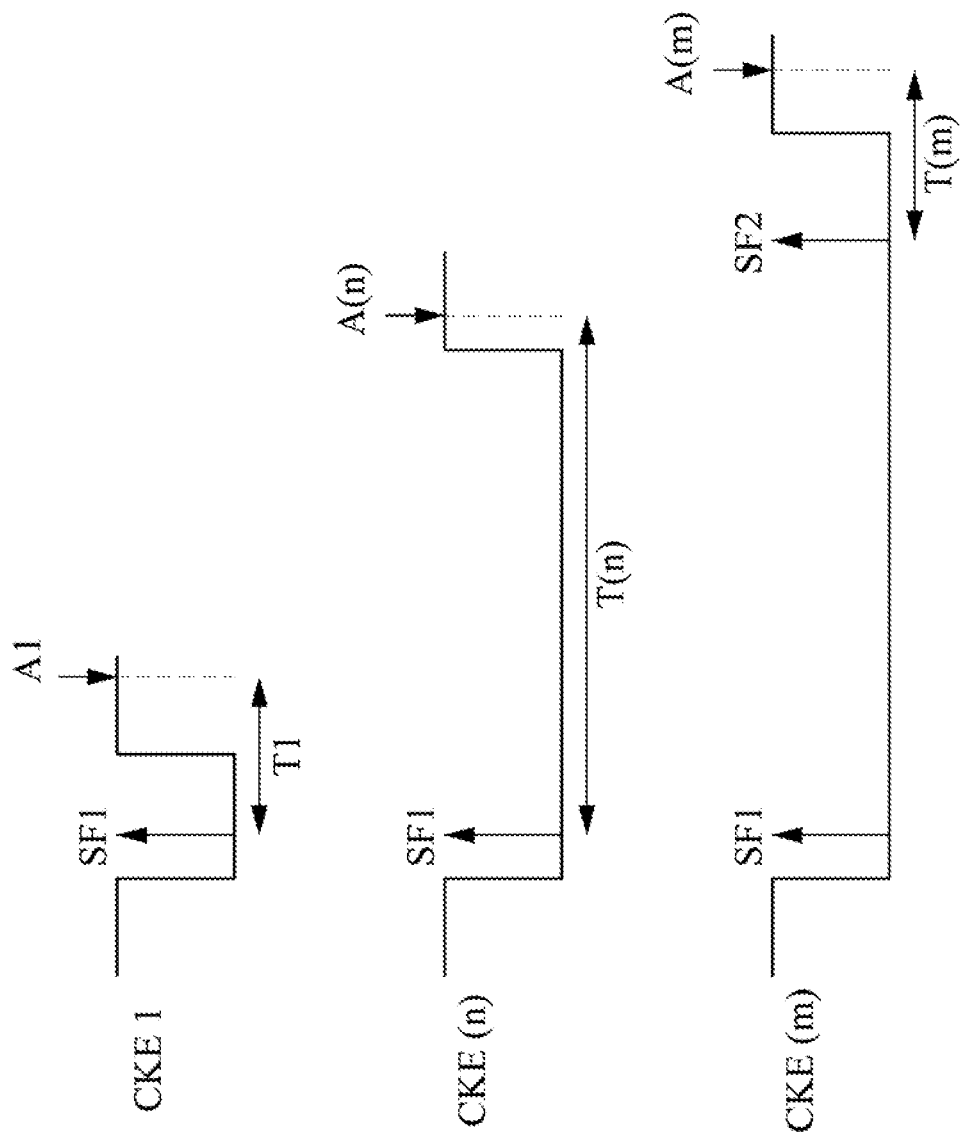
FIG. 3 depicts a schematic diagram of signal adjustment of signals of a testing system according to one embodiment of the present disclosure.

In some embodiments, in order to facilitate the understanding of a testing system 100 shown in FIG. 1. Please refer to FIG. 1 to FIG. 4B. FIG. 2 depicts a flow chart of a testing method 200 according to one embodiment of the present disclosure. FIG. 3 depicts a schematic diagram of signal adjustment of signals of a testing system 100 according to one embodiment of the present disclosure. In some embodiments, the testing method 200 for includes step 210 to step 270, which will be described as shown below.

In step 210, a first signal is input to a memory chip. In some embodiments, please refer to FIG. 1 to FIG. 3, a first signal CKE1 is input to a memory chip 110 by the test equipment 120 of the testing system 100.

In step 220, the memory chip is put into a self-refresh mode according to the first signal. In some embodiments, please refer to FIG. 1 to FIG. 3, the memory chip 110 is put into a self-refresh mode according to the first signal CKE1.

In some embodiments, the memory chip 110 is configured to generate a first self-refresh command SF1 to enter a first self-refresh procedure under the self-refresh mode when a first voltage level of the first signal CKE1 is at a low electrical potential.

In step 230, an active command is input to test the memory chip so as to generate a first testing result according to the first signal. In some embodiments, please refer to FIG. 1 to FIG. 3, an active command A1 is input to test the memory chip 110 so as to generate a first testing result according to the first signal CKE1. It should be noted that a time of the active command A1 must be when the first signal CKE1 is at a high electrical potential.

In some embodiments, a first time difference T1 is formed between the first self-refresh command SF1 and the active command A1.

Then, if the first time difference T1 is less than a refresh cycle time (tRFC) of the memory chip 110, the first testing result is that the memory chip 110 is in a data failure state. In some embodiments, the first time difference T1 also needed to be greater than a minimum time (tXPmin) to leave a power down mode of the of the memory chip 110.

Furthermore, if the first time difference T1 is greater than the refresh cycle time (tRFC) of the memory chip 110, the first testing result is that the memory chip 110 is in a data pass state.

In step 240, a bandwidth of the first signal is adjusted to generate a second signal so as to input to the memory chip. In some embodiments, please refer to FIG. 1 to FIG. 3, a bandwidth of the first signal CKE1 is adjusted to generate a second signal (e.g. a first clock enable signal CKE(n) or a second clock enable signal CKE(m)) so as to input to the memory chip 110 by the test equipment 120 of the testing system 100. It should be noted that each of n and m is a positive integer and m is greater than n.

In some embodiments, the bandwidth of the first signal CKE1 is adjusted to generate the second signals (e.g. the first clock enable signal CKE(n) and the second clock enable signal CKE(m)) one thousand times. In other words, step 240 is repeated one thousand times. It should be noted that each of adjusted bandwidths of the second signals (e.g. the first clock enable signal CKE(n) and the second clock enable signal CKE(m)) is different each time.

In step 250, the memory chip is put into the self-refresh mode according to the second signal. In some embodiments, please refer to FIG. 1 to FIG. 3, the memory chip 110 is put into the self-refresh mode according to the second signal (e.g. the first clock enable signal CKE(n) and the second clock enable signal CKE(m)) by the test equipment 120 of the testing system 100. In some embodiments, following the aforementioned step 240, step 250 can be repeated one thousand times.

In some embodiments, a time difference T(n) is formed between the first self-refresh command SF1 and the active command A(n). It should be noted that a time of the active command A(n) must be when the first clock enable signal CKE(n) is at a high electrical potential.

In some embodiments, please refer to FIG. 1 to FIG. 3, the time difference T(n) is greater than the refresh cycle time (tRFC) of the memory chip 110, the testing result is that the memory chip 110 is in the data pass state.

In step 260, the active command is input to test the memory chip so as to generate a second testing result according to the second signal. In some embodiments, the active command T(n) is input to test the memory chip 110 so as to generate a second testing result according to the second signal (e.g. the second clock enable signal CKE(m)). In some embodiments, following the aforementioned step 240 and step 250, step 260 can be repeated one thousand times.

In some embodiments, when the bandwidth of the first signal CKE(1) is adjusted to second clock enable signal CKE(m) the test equipment 120 of the testing system 100, the memory chip 110 is configured to generate a second self-refresh command SF2 to enter a second self-refresh procedure under the self-refresh mode when a second voltage level of the second signal (e.g. the second clock enable signal CKE(m)) is at a low electrical potential.

In some embodiments, please refer to FIG. 1 to FIG. 3, a second time difference T(m) is formed between the second self-refresh command SF2 and the active command A(m).

Then, if the second time difference T(m) is less than the refresh cycle time of the memory chip 110, the second testing result is that the memory chip 110 is in the data failure state.

Furthermore, if the second time difference T(m) is greater than the refresh cycle time (tRFC) of the memory chip 110, the second testing result is that the memory chip 110 is in the data pass state.

In step 270, a self-refresh rate of the memory chip is calculated according to the first testing result and the second testing result. In some embodiments, please refer to FIG. 1 to FIG. 2, a self-refresh rate of the memory chip 110 is calculated according to the first testing result and the second testing result by the test equipment 120 of the testing system 100.

Figure 4A:
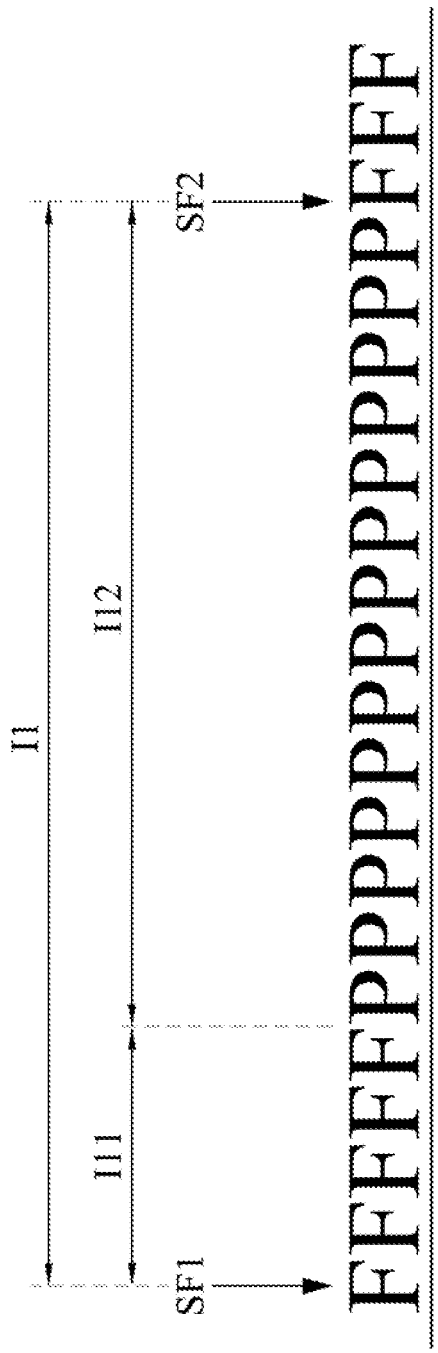
FIG. 4A depicts a schematic diagram of testing results timing in a high temperature range according to one embodiment of the present disclosure.

In some embodiments, please refer to FIG. 1, FIG. 2, and FIG. 4A. FIG. 4A depicts a schematic diagram of testing results timing in a high temperature range according to one embodiment of the present disclosure.

In some embodiments, a self-refresh period I1 is formed between the first self-refresh command SF1 and the second self-refresh command SF2. The self-refresh period I1 includes a first time interval I11 and a second time interval I12. The first time interval I11 is that the memory chip 110 is in the data failure state "F" in a high temperature range. The second time interval I12 is that the memory chip 110 is in the data pass state "P" in a high temperature range. In some embodiments, the high temperature range is between 70° C. and 80° C., or above 80° C.

In some embodiments, number of testing results is one thousand times. It should be noted that number of testing results is not limited to embodiment of figure.

In some embodiments, the test equipment 120 is further configured to calculate the self-refresh rate of the memory chip 110 according to the first time interval I11 and the second time interval I12 of the self-refresh period I1 in a low temperature range.

Figure 4B:
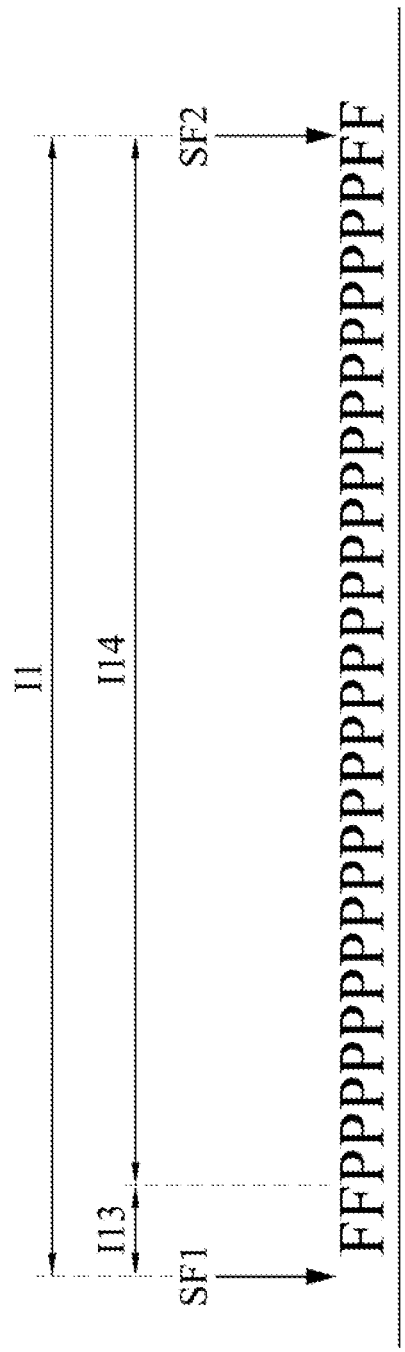
FIG. 4B depicts a schematic diagram of testing results timing in a low temperature range according to one embodiment of the present disclosure.

In some embodiments, please refer to FIG. 1, FIG. 2, and FIG. 4B. FIG. 4B depicts a schematic diagram of testing results timing in a low temperature range according to one embodiment of the present disclosure.

In some embodiments, a self-refresh period I1 is formed between the first self-refresh command SF1 and the second self-refresh command SF2. The self-refresh period I1 includes a third time interval I13 and a fourth time interval I14. The third time interval I13 is that the memory chip 110 is in the data failure state "F" in a low temperature range. The fourth time interval I14 is that the memory chip 110 is in the data pass state "P" in a low temperature range. In some embodiments, the lower temperature range is about −20° C., or a temperature that the memory chip 110 can withstand.

In some embodiments, number of testing results is one thousand times. It should be noted that number of testing results is not limited to embodiment of figure.

In some embodiments, the test equipment 120 is further configured to calculate the self-refresh rate of the memory chip 110 according to the third time interval I13 and the fourth time interval I14 of the self-refresh period I1 in a low temperature range.

Based on the above embodiments, the present disclosure provides a testing system and a testing method to calculate a self-refresh rate of a memory chip at any temperature range so as to reduce time cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A testing method, comprising:
 inputting a first signal to a memory chip;
 putting the memory chip into a self-refresh mode according to the first signal;
 inputting an active command to test the memory chip so as to generate a first testing result according to the first signal, wherein an input time of the active command must be when the first signal is at a high electrical potential;
 adjusting a bandwidth of the first signal to generate a second signal so as to input to the memory chip;
 putting the memory chip into the self-refresh mode according to the second signal;
 inputting the active command to test the memory chip so as to generate a second testing result according to the second signal, wherein the input time of the active command must be when the second signal is at a high electrical potential; and
 calculating a self-refresh rate of the memory chip according to the first testing result and the second testing result.

2. The testing method of claim 1, wherein each of the first signal and the second signal comprises a clock enable signal (CKE signal).

3. The testing method of claim 2, wherein putting the memory chip into the self-refresh mode according to the first signal comprises:
 generating a first self-refresh command to enter a first self-refresh procedure under the self-refresh mode when a first voltage level of the first signal is at a low electrical potential.

4. The testing method of claim 3, wherein a first time difference is formed between the first self-refresh command and the active command, wherein if the first time difference is less than a refresh cycle time of the memory chip, the first testing result is that the memory chip is in a data failure state.

5. The testing method of claim 4, wherein if the first time difference is greater than the refresh cycle time of the memory chip, the first testing result is that the memory chip is in a data pass state.

6. The testing method of claim 5, wherein putting the memory chip into the self-refresh mode according to the second signal comprises:
 generating a second self-refresh command to enter a second self-refresh procedure under the self-refresh mode when a second voltage level of the second signal is at a low electrical potential.

7. The testing method of claim 6, wherein a second time difference is formed between the second self-refresh command and the active command, wherein if the second time difference is less than the refresh cycle time of the memory chip, the second testing result is that the memory chip is in the data failure state.

8. The testing method of claim 7, wherein if the second time difference is greater than the refresh cycle time of the memory chip, the second testing result is that the memory chip is in the data pass state.

9. The testing method of claim 8, wherein a self-refresh period is formed between the first self-refresh command and the second self-refresh command, wherein the self-refresh period comprises a first time interval and a second time interval, wherein the first time interval is that the memory chip is in the data failure state, wherein the second time interval is that the memory chip is in the data pass state.

10. The testing method of claim 9, wherein calculating the self-refresh rate of the memory chip according to the first testing result and the second testing result comprises:
 calculating the self-refresh rate of the memory chip according to the first time interval and the second time interval.

11. A testing system, comprising:
 a memory chip; and
 a test equipment, coupled to the memory chip, and configured to generate a first signal and an active command;
 wherein the test equipment is configured to input the first signal to the memory chip, wherein the test equipment is configured to put the memory chip into a self-refresh mode according to the first signal, wherein the test equipment is configured to input the active command to test the memory chip so as to generate a first testing result according to the first signal, wherein an input time of the active command must be when the first signal is at a high electrical potential, wherein the test equipment is configured to adjust a bandwidth of the first signal to generate a second signal so as to input to the memory chip, wherein the test equipment is configured to put the memory chip into the self-refresh mode according to the second signal, wherein the test equipment is configured to input the active command to test the memory chip so as to generate a second testing result according to the second signal, wherein the input time of the active command must be when the second signal is at a high electrical potential, wherein the test equipment is configured to calculate a self-refresh rate of the memory chip according to the first testing result and the second testing result.

12. The testing system of claim 11, wherein each of the first signal and the second signal comprises a clock enable signal (CKE signal).

13. The testing system of claim 12, wherein the memory chip is configured to generate a first self-refresh command to enter a first self-refresh procedure under the self-refresh mode when a first voltage level of the first signal is at a low electrical potential.

14. The testing system of claim 13, wherein a first time difference is formed between the first self-refresh command and the active command, wherein if the first time difference is less than a refresh cycle time of the memory chip, the first testing result is that the memory chip is in a data failure state.

15. The testing system of claim 14, wherein if the first time difference is greater than the refresh cycle time of the memory chip, the first testing result is that the memory chip is in a data pass state.

16. The testing system of claim 15, wherein the memory chip is configured to generate a second self-refresh command to enter a second self-refresh procedure under the self-refresh mode when a second voltage level of the second signal is at a low electrical potential.

17. The testing system of claim 16, wherein a second time difference is formed between the second self-refresh command and the active command, wherein if the second time difference is less than the refresh cycle time of the memory chip, the second testing result is that the memory chip is in the data failure state.

18. The testing system of claim 17, wherein if the second time difference is greater than the refresh cycle time of the memory chip, the second testing result is that the memory chip is in the data pass state.

19. The testing system of claim 18, wherein a self-refresh period is formed between the first self-refresh command and the second self-refresh command, wherein the self-refresh period comprises a first time interval and a second time interval, wherein the first time interval is that the memory chip is in the data failure state, wherein the second time interval is that the memory chip is in the data pass state.

20. The testing system of claim 19, wherein the test equipment is further configured to calculate the self-refresh rate of the memory chip according to the first time interval and the second time interval.

* * * * *